(12) United States Patent
Kim et al.

(10) Patent No.: US 7,545,301 B2
(45) Date of Patent: Jun. 9, 2009

(54) MULTI-BIT DELTA-SIGMA MODULATOR

(75) Inventors: Yi Gyeong Kim, Daejeon (KR); Kwi Dong Kim, Daejeon (KR); Chong Ki Kwon, Daejeon (KR); Jong Dae Kim, Daejeon (KR)

(73) Assignee: Electronics and Telecommunications Research Institute, Daejeon (KR)

( * ) Notice: Subject to any disclaimer, the term of this patent is extended or adjusted under 35 U.S.C. 154(b) by 0 days.

(21) Appl. No.: 11/950,481

(22) Filed: Dec. 5, 2007

(65) Prior Publication Data

US 2008/0136693 A1 Jun. 12, 2008

(30) Foreign Application Priority Data

Dec. 5, 2006 (KR) ............... 10-2006-0122558
Jul. 16, 2007 (KR) ............... 10-2007-0071103

(51) Int. Cl.
*H03M 3/00* (2006.01)
(52) U.S. Cl. .................. 341/143; 341/155
(58) Field of Classification Search ........... 341/155, 341/143
See application file for complete search history.

(56) References Cited

U.S. PATENT DOCUMENTS

| 5,068,659 | A * | 11/1991 | Sakaguchi ........... 341/143 |
| 5,682,161 | A * | 10/1997 | Ribner et al. ........ 341/143 |
| 6,271,782 | B1 * | 8/2001 | Steensgaard-Madsen .... 341/143 |
| 6,462,687 | B1 * | 10/2002 | Eshraghi et al. ........ 341/143 |
| 6,693,573 | B1 | 2/2004 | Linder |
| 2004/0012514 | A1 | 1/2004 | Ollos et al. |

FOREIGN PATENT DOCUMENTS

| JP | 09-289451 | 11/1997 |
| JP | 2000-224042 | 8/2000 |
| JP | 2001-156642 A | 6/2001 |
| KR | 1020010003899 | 1/2001 |
| KR | 1020020027530 A | 4/2002 |
| KR | 2004-0062823 A | 7/2004 |
| KR | 1020040082767 | 9/2004 |
| KR | 1020060095086 | 8/2006 |
| WO | 01/11786 A1 | 2/2001 |

OTHER PUBLICATIONS

J. Silva, et al.; "Wideband low-distortion delta-sigma ADC topology", Electronics Letters 7th Jun. 2001, vol. 37, No. 12, pp. 737-738.
Jesper Steensgaard; "Nonlinearities in SC Delta-Sigma A/D Converters", Electronics, Circuits and Systems, 1998 IEEE International Conference, vol. 1, pp. 355-358.

* cited by examiner

*Primary Examiner*—Jean B Jeanglaude
(74) *Attorney, Agent, or Firm*—Ladas & Parry LLP

(57) ABSTRACT

A delta-sigma modulator having a first integrator for integrating an input signal; an analog-to-digital converter for converting the integrated signal into a digital signal; a delay circuit for delaying an output signal of the analog-to-digital converter; and a differential delay circuit for differentially delaying the output signal of the analog-to-digital converter. More particularly, the delta-sigma modulator has low distortion characteristics suitable for multi-bit fast operation, wherein a feedback signal is delayed by one clock period through the delay circuit and the differential delay circuit.

9 Claims, 2 Drawing Sheets

MULTI-BIT DELTA-SIGMA MODULATOR

CROSS-REFERENCE TO RELATED APPLICATION

This application claims priority to and the benefit of Korean Patent Application No. 2006-122558, filed Dec. 5, 2006, and No. 2007-71103, filed Jul. 16, 2007, the disclosure of which is incorporated herein by reference in its entirety.

BACKGROUND

1. Field of the Invention

The present invention relates to a multi-bit delta-sigma modulator.

The present invention has been produced from the work supported by the IT R&D program of MIC (Ministry of Information and Communication)/IITA (Institute for Information Technology Advancement) [2005-S-073-02, Development of semiconductor circuit design based on the nano-scaled device] in Korea.

2. Discussion of Related Art

Delta-sigma modulators developed prior to the 1960's are still being studied in various applications with a focus on analog-to-digital conversion technologies through the improvement of wireless communication industries.

In particular, recent efforts have been concentrating on delta-sigma modulators capable of processing wide-band multi-bits without decreasing signal-to-noise ratios, and these kinds of delta-sigma modulators are now used extensively in the fields of digital video and audio processing, wired and wireless communication, radar, and so on.

FIG. 1 is a schematic circuit diagram of a conventional second order delta-sigma modulator.

Referring to FIG. 1, the delta-sigma modulator includes a first integrator 101, a second integrator 103, an analog-to-digital converter (ADC) 105, and a digital-to-analog converter (DAC) 107.

This kind of delta-sigma modulator is a circuit that is widely used in general analog-to-digital modulation systems, as it minimizes quantization noises which are inevitably generated while converting an analog signal to a digital signal in a required low frequency band. This delta-sigma modulator is characterized by a good result for reduction of quantization noises q as high as an oversampling ratio (OSR).

However, the structure of the delta-sigma modulator shown in FIG. 1 is required to have an analog block with a low distortion characteristic in order to satisfy the distortion characteristic of the system in the condition of a low OSR. In particular, an analog circuit in the analog block must operate with a low distortion and high-speed characteristic in the case of wide-band application, but it is difficult to design the analog block with such a characteristic.

FIG. 2 is a schematic circuit diagram of a conventional delta-sigma modulator with a characteristic of low distortion.

Referring to FIG. 2, the delta-sigma modulator with low distortion characteristic includes a first integrator 201, a second integrator 203, an ADC 205, and a DAC 209. The delta-sigma modulator of FIG. 2 may further include a scrambler logic 207 in the case of processing multi-bits.

Such a low-distortion delta-sigma modulator called full-feed forward architecture is structured to directly input an analog input signal u into the ADC 205. Thus, the first and second integrators 201 and 203 are able to process only quantization noise, having an excellent input-dependent distortion characteristic.

The scrambler logic 207 is a circuit that is added to improve DAC characteristics in non-linearity caused by various non-linear characteristics in a fabrication process. The scrambler logic 207 has a delay component as a digital circuit.

However, even the full-feed forward delta-sigma modulator requires a fast feedback loop in order to eliminate delay component of analog input signal u in case of multi-bit signal, and so it requires the delay-free scrambler logic 207 and the delay-free ADC 205.

That is, an input of the ADC 205 must be guided to pass through the ADC 205, the scrambler logic 207, and the first integrator 201 in one clock period.

In this case, there is a delay component while converting a signal by the ADC 205 and the scrambler logic. Therefore, this architecture is not appropriate for a high speed converter using multi-bit architecture.

Therefore, a suitable structure of delta-sigma modulator which also has a low-distortion characteristic is required for a multi-bit fast operation.

SUMMARY OF THE INVENTION

The present invention is directed to a delta-sigma modulator suitable for a multi-bit fast operation and having a low-distortion characteristic.

The present invention is also directed to a delta-sigma modulator suitable for a multi-bit fast operation, in which a feedback signal is delayed by one clock period through a delay circuit and a differential delay circuit.

One aspect of the present invention provides a delta-sigma modulator including: a first integrator for integrating an input signal; an analog-to-digital converter for converting the integrated analog signal into a digital signal; a delay circuit for delaying an output signal of the analog-to-digital converter; and a differential delay circuit for differentially delaying the output signal of the analog-to-digital converter.

In this embodiment, the delay circuit and the differential delay circuit may delay and differentially delay the output signal of the analog-to-digital converter to feed back the resultant signal to a digital-to-analog converter. The delta-sigma modulator may further include a second integrator receiving a feedback signal through the differential delay circuit and compensating a delayed component of the feedback signal.

And, the signal input to the first integrator may include a difference between a signal resulting from summing signals fed back through the delay circuit and the differential delay circuit and an initial input signal.

Additionally, the analog-to-digital converter may receive a sum signal of the initial input signal of the first integrator, a signal corresponding to a difference between an output signal of the first integrator and the feedback signal of the differential delay circuit, and an output signal of the second integrator. The second integrator may receive a difference signal between output signal of the first integrator and the feedback signal through the differential delay circuit.

Another aspect of the present invention provides a delta-sigma modulator including: a first integrator receiving an analog input signal; a second integrator receiving a difference signal between an output signal of the first integrator and an output signal of a second digital-to-analog converter; a third digital-to-analog converter for amplifying a difference signal between the output signal of the first integrator and the output signal of the second digital-to-analog converter; an analog-to-digital converter for converting a sum signal of output signals of the second integrator and the third digital-to-analog converter and a analog initial input signal into a digital signal;

delay and differential delay circuits for delaying and differentially delaying an output signal of the analog-to-digital converter, respectively; a first digital-to-analog converter for converting a sum signal of output signals of the delay and differential delay circuits into an analog signal, and inputting the converted analog signal to the first integrator; and a second digital-to-analog converter for converting the output signal of the differential delay circuit into an analog signal, and inputting the converted analog signal to the second integrator.

BRIEF DESCRIPTION OF THE DRAWINGS

The above and other features and advantages of the present invention will become more apparent to those of ordinary skill in the art by describing in detail preferred embodiments thereof with reference to the attached drawings in which.

DETAILED DESCRIPTION OF EXEMPLARY EMBODIMENTS

Hereinafter, exemplary embodiments of the present invention will be described in detail. However, the present invention is not limited to the embodiments disclosed below, but can be implemented in various forms. Therefore, the following embodiments are described in order for this disclosure to be complete and enabling to those of ordinary skill in the art.

Figure 1:
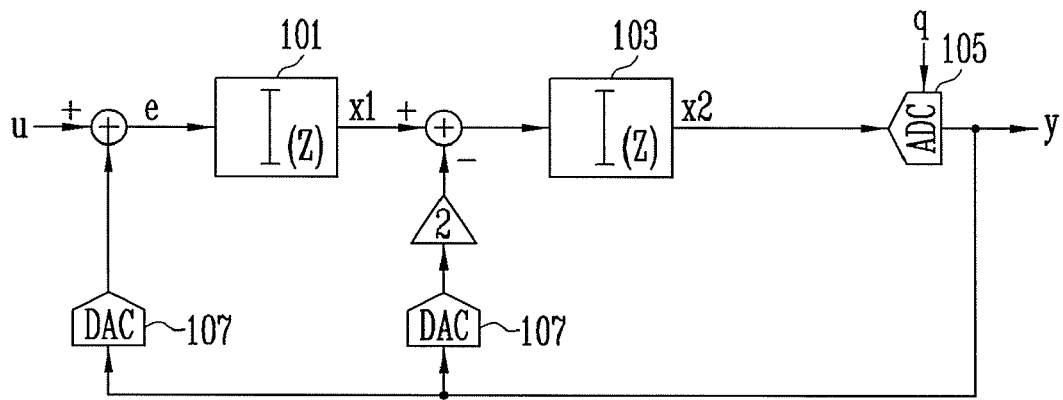
FIG. 1 is a schematic circuit diagram of a conventional second order delta-sigma modulator.
Figure 2:
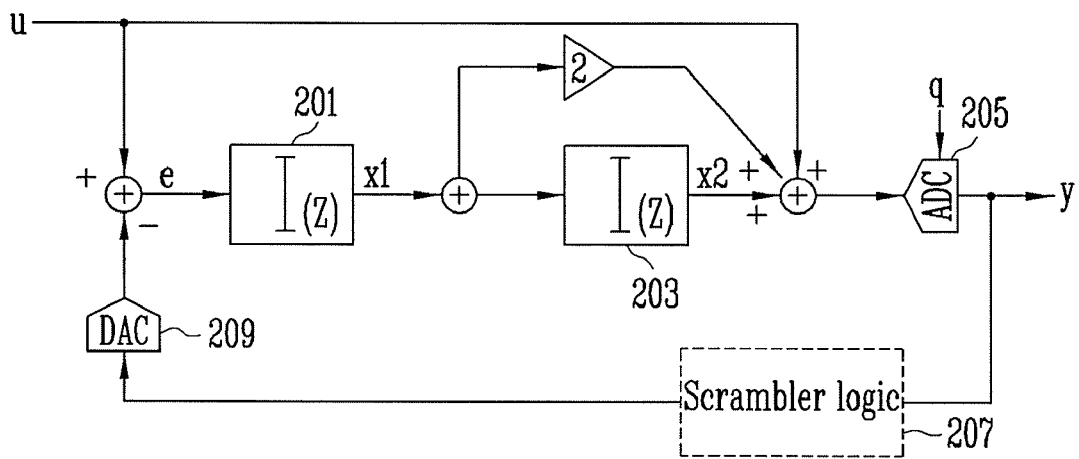
FIG. 2 is a schematic circuit diagram of a conventional delta-sigma modulator with a characteristic of low distortion.
Figure 3:
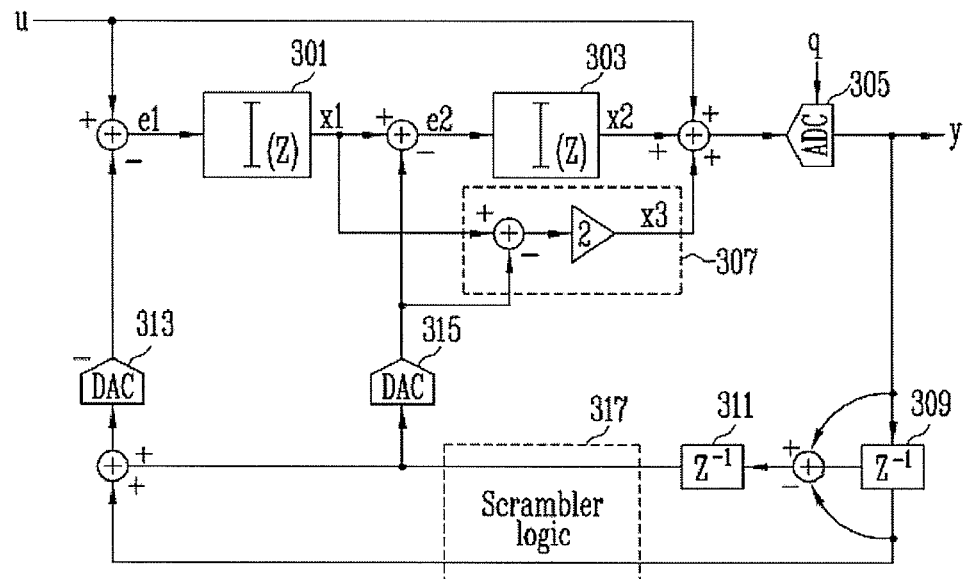
FIG. 3 is a schematic circuit diagram illustrating a structure of a delta-sigma modulator according to the present invention.

FIG. 3 is a schematic circuit diagram illustrating a structure of a delta-sigma modulator according to the present invention.

Referring to FIG. 3, the delta-sigma modulator comprises a first integrator 301, a second integrator 303, an ADC 305, a first DAC 313, a second DAC 315, a third DAC (or multi-bit DAC) 307, a delay circuit 309, differential delay circuits 309 and 311, and a scrambler logic 317.

The first integrator 301 functions to integrate differences between an analog input signal u and a feedback signal. Here, the feedback signal is a signal in which the delay circuit 309 and the differential delay circuits 309 and 311 are summed and then output through the first DAC 313.

Signals e1 and x1 input and output to and from the first integrator 301 are derived from Equation 1 below.

$$E1(z) = -Q(z) \cdot (1-z^{-1})^2 + Y(z) \cdot (1-z^{-1})^2$$

$$X1(z) = Q(z) \cdot z^{-1} \cdot (1-z^{-1}) + Y(z) \cdot z^{-1} \cdot (1-z^{-1}) \quad \text{[Equation 1]}$$

Here, Q(z) represents a quantization noise and Y(z) is an output signal. A value of z is a variable generated by the Z-transform operation.

From Equation 1, the output signal x1(z) of the integrator is differentiated, it can be expected that a level of a signal component may be greatly reduced.

When the signal component decreases in level, a nonlinear characteristic of the integrator is also greatly reduced. Thus, it is able to reduce an effect due to signal distortion.

The second integrator 303 functions to integrate an input signal e2 resulting from difference between the output signal x1 of the first integrator 301 and a feedback signal output from the second DAC 315.

In this case, the input signal e2 provided to the second integrator 303 contains a quantization noise only, as shown in Equation 2 below.

$$E2(z) = Q(z) \cdot z^{-1} \cdot (1-z^{-1}) \quad \text{[Equation 2]}$$

Therefore, the second integrator 303 processes the quantization noise only, preventing signal distortion.

The third DAC 307 functions to amplify the signal e2 that is the same as the input signal of the second integrator 303, and input the amplified signal into the ADC 305.

Even in the third DAC 307, as the input signal excludes the analog signal component u, there is no distortion according to the input signal thereof.

The ADC 305 functions to output a digital signal from an input signal resulting from the total summing of the output signal x2 of the second integrator 303, an output signal x3 of the third DAC 307, and the analog input signal u.

And the output signal is fed back to the original input stage. In this case, the feedback path is divided into two paths: one through the delay circuit 309 only, and the other through the differential delay circuits 309 and 311.

In the differential delay circuits 309 and 311, as a signal input to the $Z^{-1}$ block 311 along the feedback path is evaluated in $Y-YZ^{-1}$, a signal output from the $Z^{-1}$ block 311 results in $YZ^{-1}(1-Z^{-1})$, by which a differential delay component is fed back to the original input stage.

The scrambler logic 317 is a circuit that is added to improve DAC characteristics in non-linearity caused by various non-linear characteristics in a fabrication process.

The scrambler logic 317 has a delay component as a digital circuit.

In the circuit shown in FIG. 3, as the feedback component contains the delay and differential delay components, and the feedback signal is delayed by one clock period until input to the DAC, it is able to process the operation although there is a delay through the scrambler logic 317. Thus, it is not affected by the conversion delay time of the scrambler logic and ADC, even though the circuit of FIG. 3 is formed to process multi-bits having a low-distortion characteristic.

Figure 4:
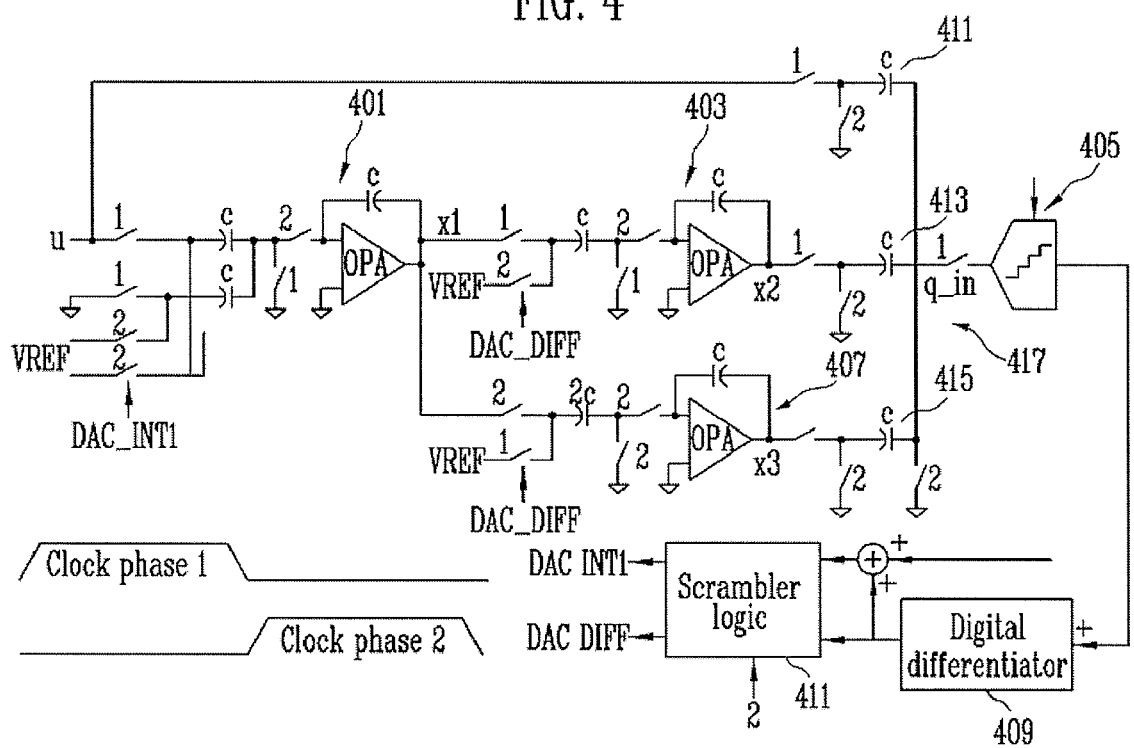
FIG. 4 is a schematic circuit diagram illustrating a structure of a delta-sigma modulator according to an exemplary embodiment of the present invention.

FIG. 4 is a schematic circuit diagram illustrating a structure of a delta-sigma modulator according to an exemplary embodiment of the present invention.

As shown in FIG. 4, a switched capacitor circuit is used for a second order delta-sigma modulator as an exemplary embodiment of the present invention. However, the present invention is also applicable to other kinds of circuits, such as continuous time circuits, besides the switched capacitor circuit.

The delta-sigma modulator shown in FIG. 4 is similar to that shown in FIG. 3, the structure including a first integrator 401, a second integrator 403, a third DAC 407, an ADC 405, a digital differentiator 409, and a scrambler logic 411.

The integrators 401 and 403 and the third DAC 407 are implemented by operational amplifiers, and the signal subtracter and adder shown in FIG. 3 are implemented by switched capacitors each coupled to the fronts of the operational amplifiers.

An operation of the second order delta-sigma modulator shown in FIG. 4 is basically the same as the delta-sigma modulator shown in FIG. 3, and thus the relationships between signals and clocks therein will be described, excluding the operations of the integrator and the third DAC.

Numerals 1 and 2 in FIG. 4 represent clock phases by the switched operations. For instance, the switches noticed by 1 are turned on when the clock phase is 1 (i.e., clock phase 1), while the switches noticed by 2 are turned on when the clock phase is 2 (i.e., clock phase 2). The patterns of the clock phases are shown in FIG. 4.

In the switching patterns relevant to timing operations according to the present invention, an input signal q-in which is summing of an initial input u, an output signal of second integrator 403 and an output signal of integrator 407. In order to sum these analog signals, the capacitors 411, 413, and 415 are used. In this case the capacitors 411, 413, and 415 charged during the clock phase 1, and discharged during the clock phase 2, and an input node of the coupled ADC is connected to the ADC 405 through the switch 417 when the clock phase is 1.

The signal input to the connection node is converted into a digital signal at an end of clock phase 1. Subsequently, the scrambler logic 411 processes the converted digital signal during clock phase 2. And then, an output signal of the scrambler logic fed back and input to the DAC again during next clock phase 1 and 2.

In the DELA-SIGMA modulator, the scrambler logic 411 operates during clock phase 2 and the ADC 405 operates during clock phase 1. It relaxes a allowable time for the ADC 405 and scrambler logic 411 to operate, thus it is possible to remarkably reduce malfunctions of clock timing operation due to operational delays through the ADC and the scrambler logic 411.

As described above, the present invention provides a delta-sigma modulator suitable for a multi-bit fast operation, having a low-distortion characteristic.

Moreover, the present invention provides a delta-sigma modulator suitable for a multi-bit fast operation, in which a feedback signal is delayed by one clock period through a delay circuit and a differential delay circuit.

While the invention has been shown and described with reference to certain exemplary embodiments thereof, it will be understood by those skilled in the art that various changes in form and details may be made therein without departing from the spirit and scope of the invention as defined by the appended claims.

What is claimed is:

1. A delta-sigma modulator comprising:
    a first integrator for integrating a sum analog input signal;
    an analog-to-digital converter for converting the integrated analog signal into a digital signal;
    a delay circuit for delaying an output signal of the analog-to-digital converter; and
    a differential delay circuit for differentially delaying the output signal of the analog-to-digital converter,
    wherein the output signals of the differential delay circuit and the delay circuit are summed after one clock period for outputting an analog signal, and
    wherein the sum input analog signal corresponds to a difference between an analog input signal and the summed analog output signal of the differential delay circuit and the delay circuit that has been delayed by one clock period.

2. The delta-sigma modulator of claim 1. wherein the delay circuit and the differential delay circuit delay and differentially delay the output signal of the analog-to-digital converter to feed back the resultant signal to a digital-to-analog converter.

3. The delta-sigma modulator of claim 1, further comprising:
    a second integrator receiving the signal fed back from the differential delay circuit, and compensating a delayed component of the feedback signal.

4. The delta-sigma modulator of claim 1, wherein The signal inputting to the first integrator comprises a difference between a signal resulting from summing signals fed back through the delay circuit and the differential delay circuit and an initial input signal.

5. The delta-sigma modulator of claim 4, wherein the signal resulting from summing the signals fed back through the delay circuit and the differential delay circuit is converted into an analog signal by a digital-to-analog converter and then input to the first integrator.

6. The delta-sigma modulator of claim 3, wherein the analog-to-digital converter receives a sum signal of the input signal of the first integrator, a signal corresponding to a difference between an output signal of the first integrator and the feedback signal of the differential delay circuit, and an output signal of the second integrator.

7. The delta-sigma modulator of claim 3, wherein the second integrator receives an output signal of the first integrator.

8. The delta-sigma modulator of claim 3, wherein the second integrator receives a signal corresponding to a difference between the feedback signal of the differential delay circuit and an output signal of the first integrator.

9. A delta-sigma modulator comprising:
    a first integrator receiving a sum analog input signal;
    a second integrator receiving a difference between signal of an output signal of the first integrator and an output signal of a second digital-to-analog converter;
    a third digital-to-analog converter for amplifying a difference between signal of the output signal of the first integrator and the output signal of the second digital-to-analog converter;
    an analog-to-digital converter for converting a sum signal of output signals of the second integrator and the third digital-to-analog converter and a analog initial input signal, into a digital signal;
    delay and differential delay circuits for delaying and differentially delaying an output signal of the analog-to-digital converter, respectively;
    a first digital-to-analog converter for converting a sum signal of output signals of the delay and differential delay circuits into an analog signal, and inputting the converted analog signal to the first integrator; and
    a second digital-to-analog converter for converting the output signal of the differential delay circuit into an analog signal, and inputting the converted analog signal to the second integrator,
    wherein the output signals of the differential delay circuit and the delay circuit are summed after one clock period for outputting an analog signal, and
    wherein the sum analog input signal corresponds to a difference between an analog input signal and the summed analog output signal of the differential delay circuit and the delay circuit that has been delayed by one clock period.

* * * * *